United States Patent
Chu et al.

(10) Patent No.: US 6,329,325 B1
(45) Date of Patent: Dec. 11, 2001

(54) HIGH TEMPERATURE SUPERCONDUCTING TAPE AND METHOD OF MANUFACTURE

(75) Inventors: Ching-Wu Chu; Ruling L. Meng; Yu-Yi Xue, all of Houston, TX (US)

(73) Assignee: University of Houston, Houston, TX (US)

( * ) Notice: Subject to any disclaimer, the term of this patent is extended or adjusted under 35 U.S.C. 154(b) by 0 days.

(21) Appl. No.: 09/112,688

(22) Filed: Jul. 9, 1998

Related U.S. Application Data

(62) Division of application No. 08/784,272, filed on Jan. 15, 1997, now Pat. No. 5,906,964.

(51) Int. Cl.[7] .................................................. H01L 39/24
(52) U.S. Cl. ......................... 505/434; 505/470; 505/500; 148/277; 148/280
(58) Field of Search .................................. 148/277, 280; 505/300, 430, 434, 470, 500

(56) References Cited

U.S. PATENT DOCUMENTS

| 5,071,828 | 12/1991 | Greuter et al. ................... 505/237 X |
| 5,462,921 | 10/1995 | Adacht et al. .................... 505/125 X |
| 5,578,551 | * 11/1996 | Chu et al. .............................. 505/125 |
| 5,599,775 | 2/1997 | Itoh et al. ........................... 505/125 X |
| 5,652,199 | * 7/1997 | Isawa et al. ........................ 505/441 |
| 5,858,926 | * 1/1999 | Schwartz et al. .................... 505/120 |
| 5,883,050 | * 3/1999 | Yun et al. ............................. 505/125 |

OTHER PUBLICATIONS

Wang, et al.; Synthesis of preferred–oriented $HgBa_2Ca_2Cu_2O_{8+\delta}$ thin films; Appl. Phys. Lett. 63; Nov., 1993 pp. 3084–3086.

Meng, et al. Synthesis of the high–temperature superconductors $HgBa_2Ca_2Cu_2O_{8+\delta}$ and $HgBa_2Ca_2Cu_3O_{8+\delta}$; Physica C Superconductivity; Phisica C216 (1993) 21–28. (No month data).

* cited by examiner

Primary Examiner—John Sheehan
Assistant Examiner—Andrew L. Oltmans
(74) Attorney, Agent, or Firm—Akin, Gump, Strauss, Hauer & Feld, L.L.P.

(57) ABSTRACT

Highly oriented $HgBa_2Ca_2Cu_3O_{8+\delta}$ on Ni-tapes with a buffer layer of Cr/Ag or Cr/(Ag—Pd) have been described with a high transition temperature are described along with, one and two step methods of manufacture.

12 Claims, 12 Drawing Sheets

HIGH TEMPERATURE SUPERCONDUCTING TAPE AND METHOD OF MANUFACTURE

This is a division of application Ser. No. 08/784,272 filed Jan. 15, 1997 now U.S. Pat. No. 5,906,964.

BRIEF DESCRIPTION OF THE INVENTION

This invention relates generally to a high-temperature superconducting (HTSg) tape and method of manufacture and more particularly to a nickel tape having a highly oriented $HgBa_2Ca_2Cu_3O_{8+\delta}$ layer and to method of manufacture.

BACKGROUND OF THE INVENTION

Layers of superconducting cuprate materials $Bi_2Sr_2Ca_{n-1}Cu_nO_y$ (n=2 or 3) and $Tl_2Ba_2Co_2Cu_3Oy$ and $TlB_2C_2Cu_3Oy$ have been formed as a thin film on Ag tape to provid superconducting tapes.

The newly discovered high-temperature superconducting (HTSg) compound, $HgBa_2Ca_2Cu_3O_{8+\delta}$ (Hg-1223) displays the highest transition temperature ($T_c$) of 134 K at ambient pressure or 164 K at ~30 GPa. It also exhibits a modest flux pinning strength which lies between those of $YBa_2Cu_3O_7$ (YBCO) and $Bi_2Sr_2Ca_{n-1}Cu_nO_{2n+4+\delta}$ (BSCCO) [or $Tl_2Ba_2Ca_{n-1}Cu_nO_{2n+4+\delta}$ (TBCCO)] with n =1, 2, 3, . . . , suggesting a possible high critical current density ($J_c$) at 77 K due to its higher Tc. Indeed, epitaxial thin films of $HgBa_2CaCu_2O_{6+\delta}$ (Hg-1212), which have a $T_c$ ~128 K and are homologous to Hg-1223, have been prepared and show a $J_c$~$10^6$ A/cm$^2$ at 100 K, implying a $J_c$~$5\times10^6$ A/cm$^2$ at 77 K. Since Hg-1223 has a higher $T_c$ than Hg-1212, a $J_c \geq 5\times10^6$ A/cm$^2$ at 77 K may be achievable in Hg-1223. Given the superior superconducting properties, Hg-1223 is therefore a desirable HTSg material for conductors, such as tapes and wires. Unfortunately, Hg-1223 is difficult to form and the compound is chemically unstable with the loss of Hg and the associated degradation at temperatures above ~350° C. This makes it extremely difficult to align the $CuO_2$-planes by the high-temperature melt-texturing technique commonly used for other HTSg materials. Added to the difficulty is the fact that the Hg released from the compound attacks many metals, especially at high temperatures, and forms amalgams.

OBJECTS AND SUMMARY OF THE INVENTION

It is an object of the present invention to provide a highly oriented $HgBa_2Ca_2Cu_3O_{8+\delta}$ (Hg-1223) tape and process for its manufacture.

It is a further object of the present invention to provide a tape comprising a thick film of Hg-1223 attached to a nickel tape via a thin Cr/Ag or Cr/(Ag—Pd) buffer layer.

It is another object of the present invention to provide highly oriented $HgBa_2Ca_2Cu_3O_{8+\delta}$ on Ni-tape with a buffer layer of Cr/Ag or Cr/(Ag—Pd) and to a method of manufacture.

There is provided a high temperature superconducting (HTSg) tape comprising a nickel tape covered with a Cr/Ag or Cr/(Ag—Pd) buffer layer onto which a thick highly oriented $HgBa_2Ca_2Cu_3O_{8+\delta}$ layer is formed and to a method of manufacture.

BRIEF DESCRIPTION OF THE FIGURES

The foregoing and other objects of the invention will be more clearly understood from the following detailed description when read in conjunction with the accompanying drawings.

FIG. 8 also shows the current-voltage characteristics of a sample prepared by the one-step spray/press process for comparison.

DESCRIPTION OF THE PREFERRED EMBODIMENT

Figure 1A:
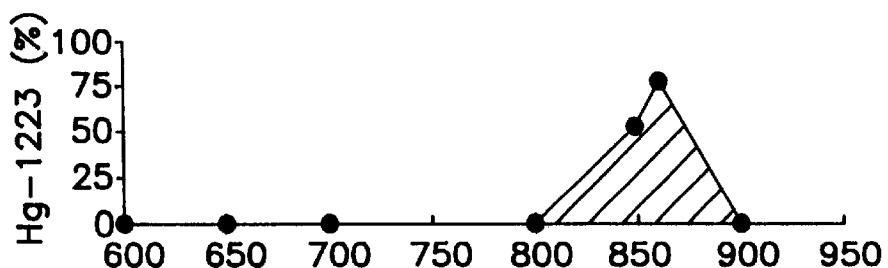
FIGS. 1A–E show the formation of various phases of Hg-1212 and Hg-1223 in $Re_{0.1}Ba_2Ca_2Cu_3O_x$+Hg-vapor at various reaction temperatures.
Figure 1B:
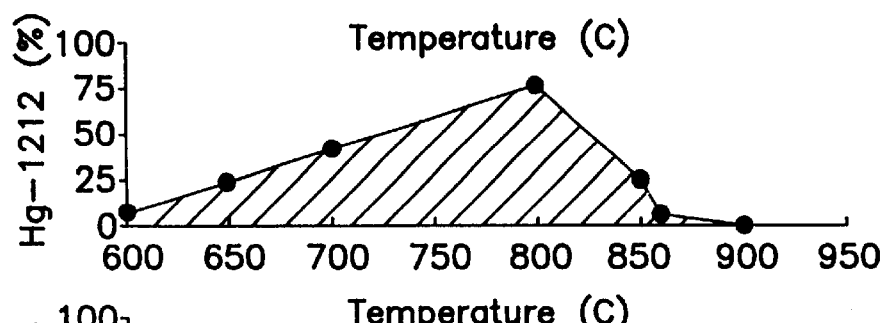
Figure 1C:
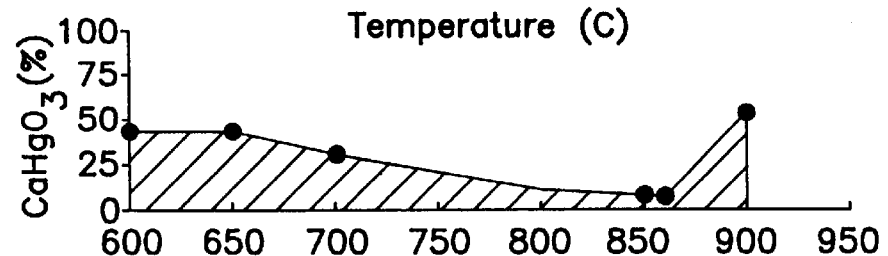
Figure 1D:
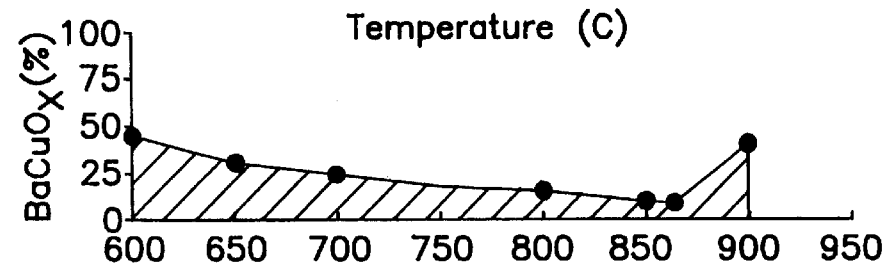
Figure 1E:
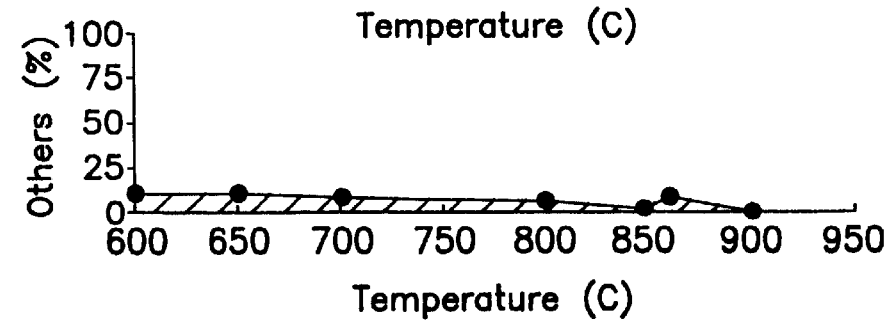
Figure 2A:
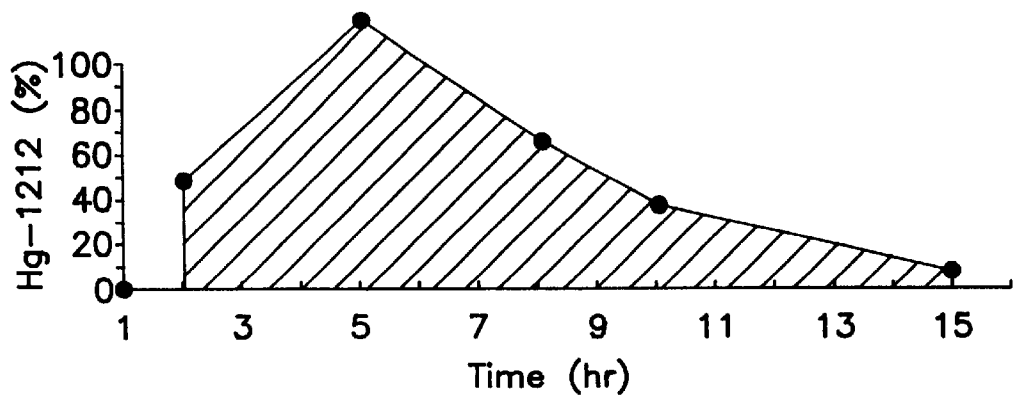
FIGS. 2A–B show the evolution of Hg-1223 from Hg-1212 in $Re_{0.1}Ba_2Ca_2Cu_3O_x$+Hg-vapor at 860° C. for various reaction times.
Figure 2B:
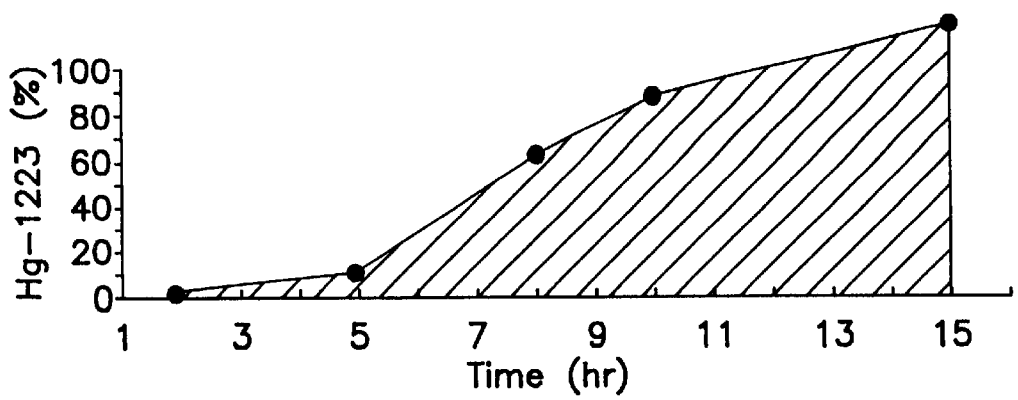
Figure 3A:
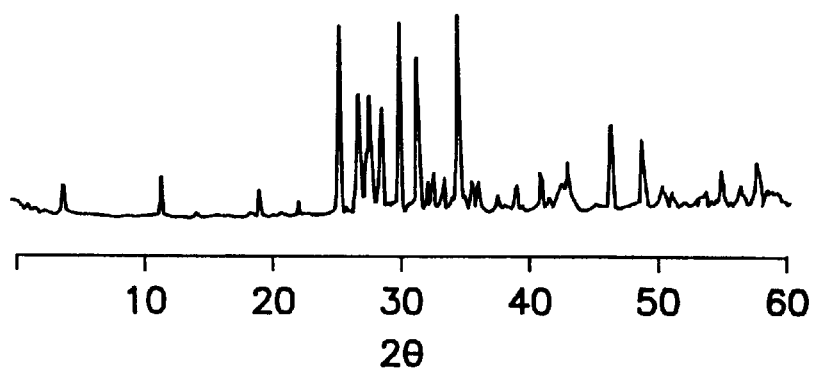
FIGS. 3A–D shows XRD patterns for samples A, B, C, and D, which were reacted at 860° C. for 1, 2, 10, and 15 hrs, respectively, after one-step press/heat processing.
Figure 3B:
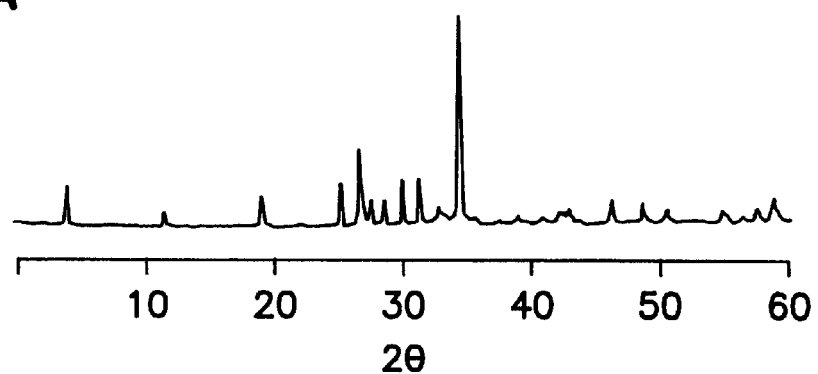
Figure 3C:
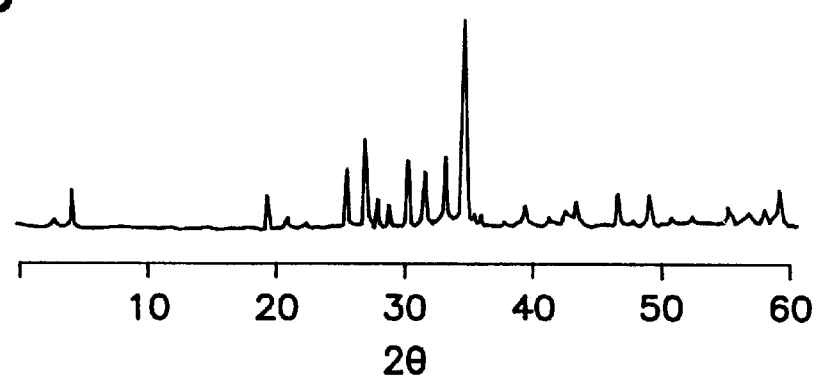
Figure 3D:
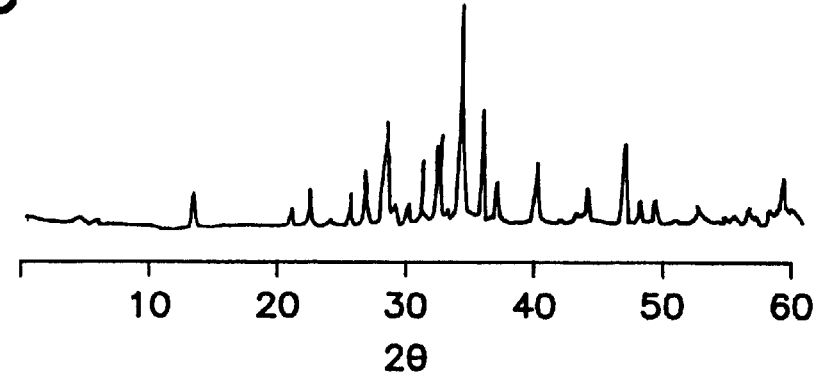

The first step in the formation of a high-temperature superconducting (HTSg) tape is the selection of the substrate or tape. It is preferable that the substrate material of a HTSg tape be metallic, flexible, chemically stable under the processing conditions, strongly adhesive to the HTSg material, and inexpensive. While Cu, Fe and stainless steel satisfy many of the above criteria, they degrade in the presence of Hg and/or O. The degradation is especially severe as the temperature increases. Ni is relatively stable in Hg- and O-atmospheres at high temperatures, e.g. the solubility of Ni in Hg at 550° C. is $8.5\times10^{-3}$ wt. %. No noticeable change in the brittleness of the Ni-substrate was observed after synthesis, suggesting that the possible corruption of Ni by Hg-vapor is not severe. Unfortunately, we found that, when applied by mechanical means such as pressing or rolling, the precursor-layer for Hg-1223 does not stick to the Ni-tape. A buffer layer of Cr with a thickness of ~300–2000 Å was therefore sputtered onto the Ni-tape. A thick precursor-layer was then sprayed onto the Ni-tape with the Cr-buffer layer and adhered to the buffer layer. The Hg-1223 layer remained stuck to the Ni-tape after being processed up to 870° C. as will be presently described. We detected no Hg in the Ni-substrate of the Hg-1223 tape processed within the resolution of ~1% of our energy dispersive analysis of X-ray (EDAX) probe, due to either the small solubility of Hg in Ni or the protection of the Cr-buffer layer under our processing conditions. To take advantage of the possible lowering of the melting temperature observed previously in the interface between Ag and high temperature superconductors (HTSrs), such as YBCO and BSCCO, a thin layer of Ag or (Ag—Pd) of ~50 Å–2000 Å was also sputtered on to the top of the Cr buffer-layer before the Hg-1223 precursor layer was applied.

Although it is known that Ag and Hg form an amalgam, at high processing temperature the Ag/Hg amalgam decomposes and releases the Hg. To further protect the Ni-substrate, all surfaces of the Ni-tape were coated with Cr which is about 100 times less soluble in Hg than Ni. The substrate used in the study was Ni-tape coated with a ~300–20 Å thick Cr-film on both sides with ~50 Å–2000 Å Ag or (Ag—Pd) film on the side onto which the Hg-1223 precursor was applied. We have found that Hg-1223 can be formed on the Ni-tape with Cr-buffer layer with the thin Ag or (Ag—Pd) coating and sticks to the Ni-tape better with the Ag or (Ag—Pd) coating than without.

The precursor used was a thoroughly mixed powder of $ReO_2$, BaO, CaO and CuO with a nominal proportion of 0.1:2:2:3. The slight addition of $ReO_2$ to the mixture enables the handling of these oxide powders in air without inhibiting the final formation of Hg-1223. It has also been demonstrated very recently that the Hg vapor-pressure of the Hg-1223 compound is drastically reduced at high temperatures by a factor of ~3, in samples with $ReO_2$-doping when compared to those without, suggesting a more stable Hg-1223 with $ReO_2$-doping. The compacted pellets of precursor were then heated in a flowing mixed atmosphere of $O_2$(8%) and Ar (92%) at 840–880° C. for 40–70 hrs with two intermediate grindings. The post-treated precursor having a nominal composition of $Re_{0.1}Ba_2Ca_2Cu_3Oy$ was then pulverized with particle sizes between 1 and 10 μm. The powder-precursor was mixed with alcohol and sprayed onto the Ni-tape with a buffer layer of Cr/Ag or (Ag—Pd) to a thickness of ~10–40 μm. The precursor/buffer-layer/Ni-composite tape was then compressed under a pressure of ~0.27–0.70 GPa at room temperature.

The compressed precursor/buffer layer/Ni composite was then heated with a solid Hg-vapor source (unreacted $HgBa_2Ca_2Cu_3O_x$) in a sealed quartz tube at 840–870° C. For the preferred two-step spray/press process, an additional press was applied to the above tapes followed by a heat-treatment at 840–870° C. for 10 hrs in a quartz tube sealed with a fresh solid Hg-vapor source. The specifics of this second press/heat-treatment which is critical to achieving the improved $J_c$, is described in detail below.

We first examined the formation of Hg-1223 in the precursor after it was reacted with the Hg-vapor provided by a solid Hg source in a sealed quartz tube as a function of reaction temperature and reaction time. The power X-ray diffraction (XRD) data for a fixed reaction time of 2 hrs are shown in FIGS. 1A–D and 2A–D. It is evident from FIGS. 1A–E that Hg-1212 starts to form at temperatures as low as 600° C. with an optimal formation temperature at 800° C. It then transforms into Hg-1223 above 800° C. by reacting with $BaCuO_x$, and other oxides present, with an optimal transformation temperature at 860° C. At temperatures above ~900° C., both Hg-1212 and Hg-1223 decompose. It is also clear from FIGS. 2A–D that Hg-1212 first appears in heating the ($Re_{0.1}Ba_2Ca_2Cu_3O_x$+Hg-vapor) at 860° C. and turns into Hg-1223 as the reaction time increases. These observations suggest that the formation of Hg-1212 depends on reaction temperature and reaction time in a complex way, that Hg-1223 can grow from Hg-1212, and that small Hg-1212 grains may serve as the nucleation sites for large Hg-1223 grain growth. The question that remains is how to control the final orientation of the large Hg-1223 grains so grown. We discovered that small Hg-1212 grains with mechanically induced orientation serve as the desired nucleation sites.

We then chose to investigate the use of Hg-1212 grains as nucleation centers for the Hg-1223 grain growth with preferred orientation. Precursor tapes were first prepared by applying and compressing the precursor. The tapes were then sealed in a quartz tube and heated with the solid Hg-vapor source for various periods of time at the optimal reaction temperature of 860° C. Their phases and microstructures were subsequently examined by XRD using the Rigaku DMAX/BIII powder diffractometer and scanning electron microscope (SEM). These treated tapes were then compressed mechanically and heated again at 860° C. in a quartz tube sealed with a new solid Hg-vapor source for an additional 10 hrs, followed by similar phase and microstructure analyses. Typical XRD patterns of four tapes (A, B, C, and D) after the first press and heat-treatment for (1, 2, 10, and 15 hrs), respectively, are summarized in FIGS. 3A–D. The initial appearance of the Hg-1212 together with other impurity phases and the later increasing presence of the Hg-1223 phase with reaction time are evident. To assess the c-axis orientation of the Hg-1212 and Hg-1223 grains in these tapes, the Lotgerning factor (F) was calculated, $F=(P-P_o)/(1-P_o)$, where $P=\Sigma I_{(ool)}/\Sigma I_{(hkl)}$ is the ratio of the intensity sum of the (ool) reflections to that of all (hkl) reflections, and $P_o$ is the P calculated for a randomly oriented specimen. The F-value for these single-step processed samples is given in Table 1. In general, F is found to be improved with reaction time. F for Hg-1212 increases until Hg-1212 starts to transform into Hg-1223.

The SEM data showing the microstructures of these tape samples are displayed in FIGS. 4A–D. Small needle-like Hg-1212 grains (~10μm) appeared, mixing with small $BaCuO_x$ crystallites in Sample A, which was heated for 1 hr without substantial preferred orientation. As the reaction time increases to 2 hrs (Sample B), large c-oriented (≧20 μm) Hg-1212 grains cover most of the tape surface, with the rest of the surface filled with small $BaCuO_x$ particles. In Sample C, which was heated for 10 hrs, more Hg-1212 grains are developed and Hg-1223 grains begin to appear with c-axis preferred orientation. Further heat treatment to 15 hrs (Sample D), Hg-1223 grains with c-axis orientation grow bigger at the expense of the Hg-1212 grains. The observation is consistent with the XRD data, i.e., as reaction time increases, F increases, the volume fraction of Hg-1223 increases, and Hg-1223 grows from Hg-1212 in the presence of the needed Ca and Cu cation oxides.

Figure 5A:
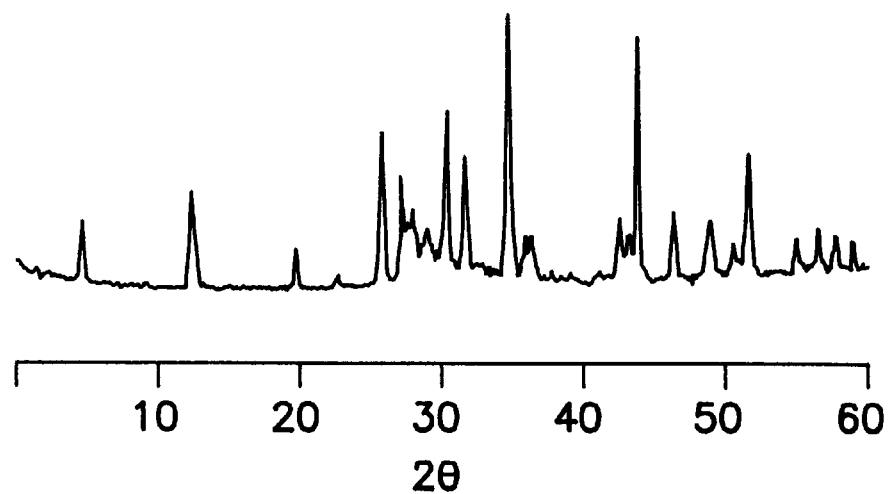
FIGS. 5A–B show the XRD patterns of the samples shown in FIGS. 3A–D followed by a second mechanical pressing.
Figure 5B:
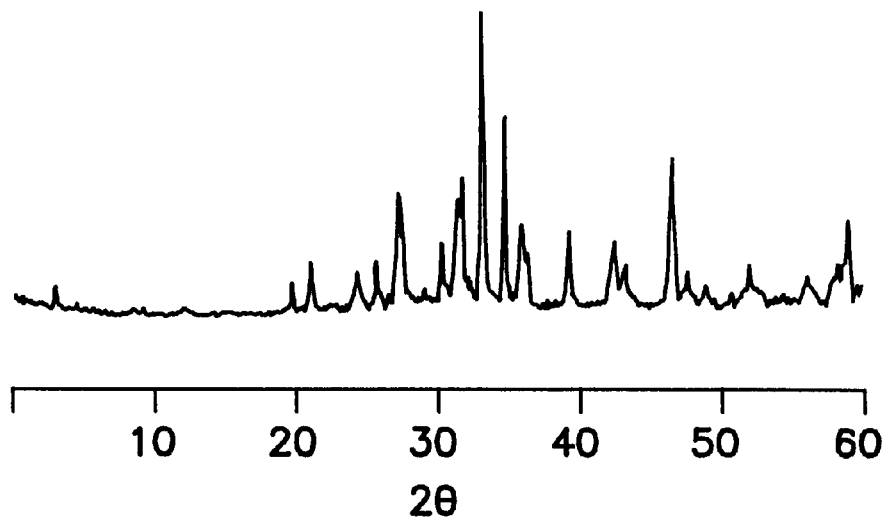
Figure 6A:
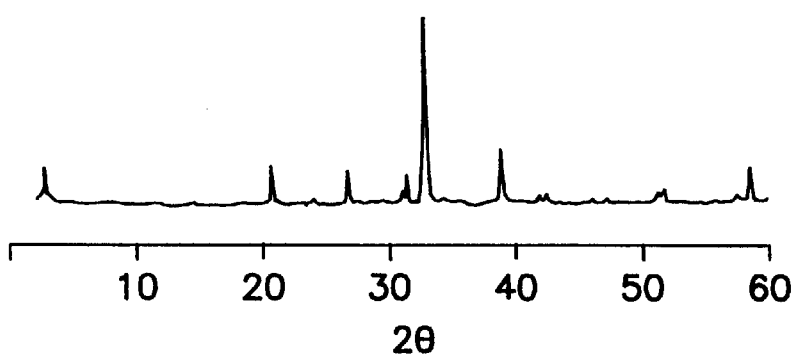
FIGS. 6A–D show the XRD patterns of the samples shown in FIGS. 5A–B followed by a second heat-temperature at 860° C. for 10 hrs.
Figure 6B:
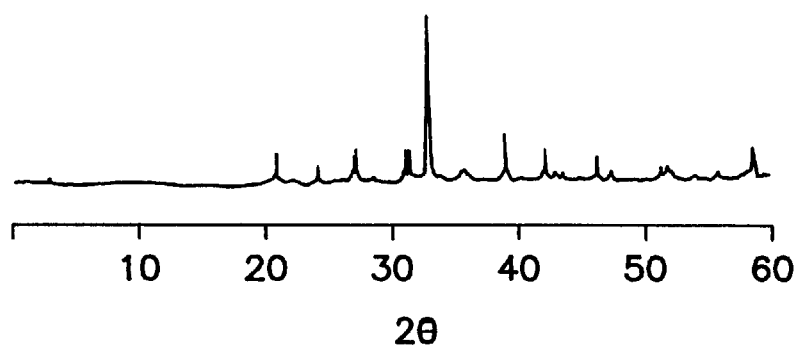
Figure 6C:
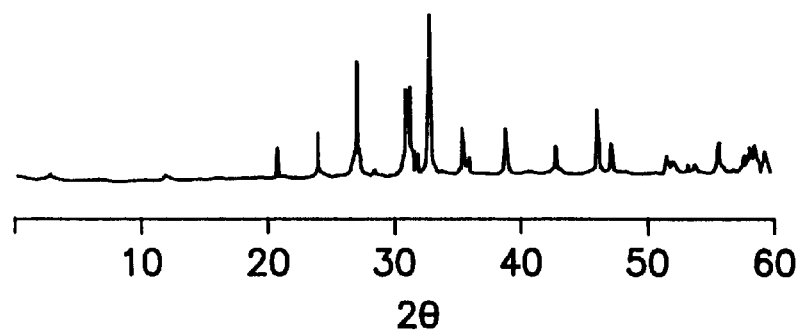
Figure 6D:
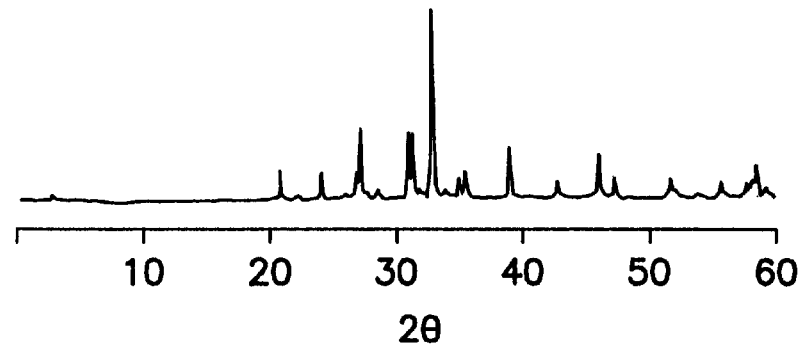
Figure 7A:
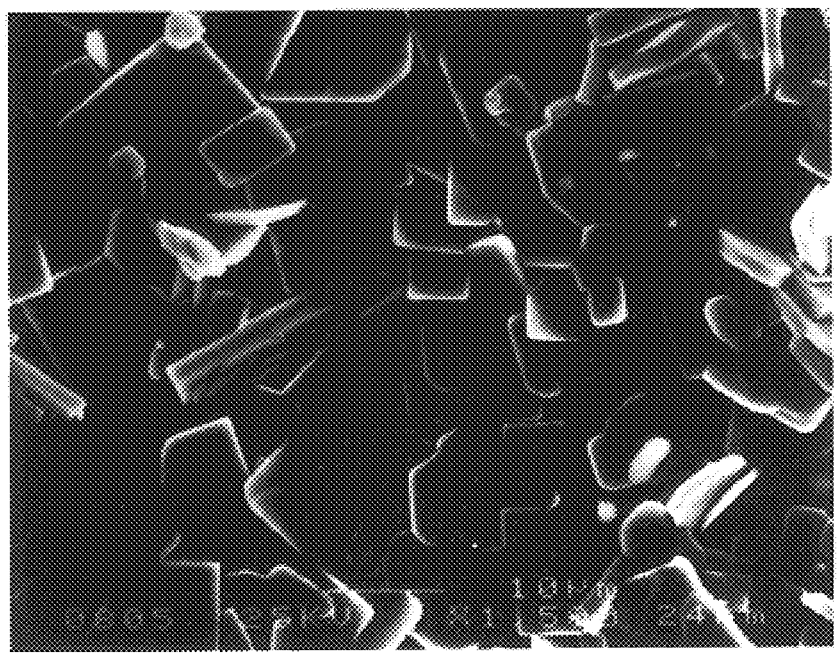
FIGS. 7A–D show the SEMs for samples examined in FIGS. 6A–D.
Figure 7B:
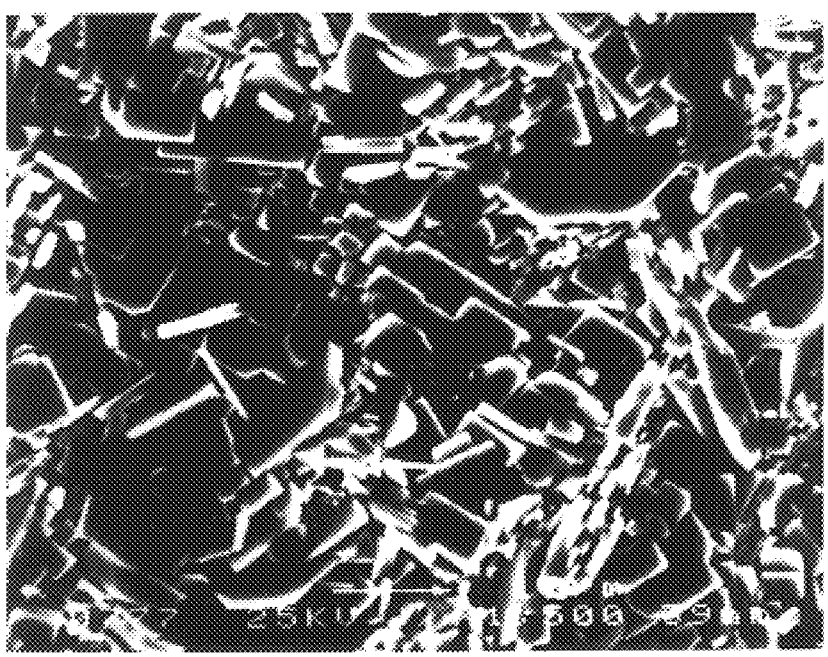
Figure 7C:
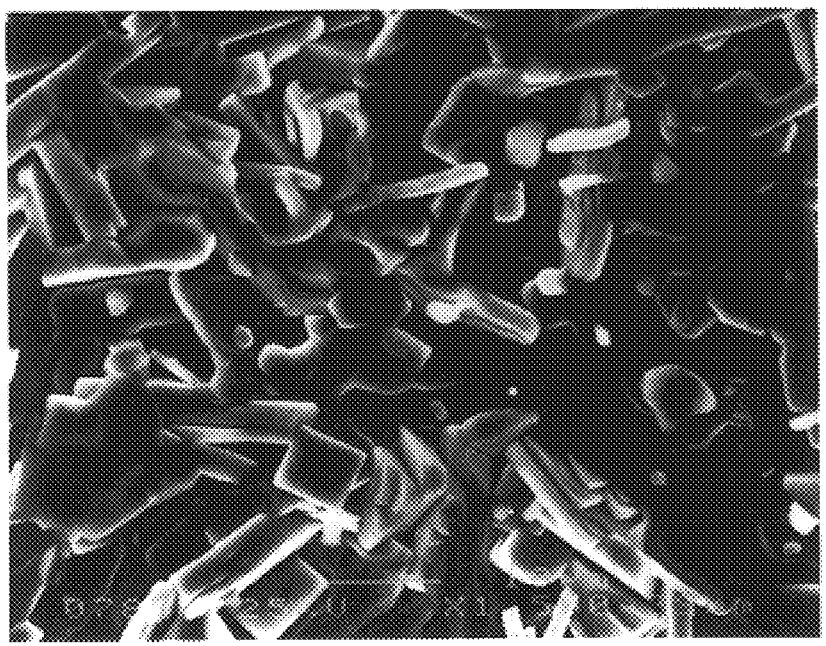
Figure 7D:
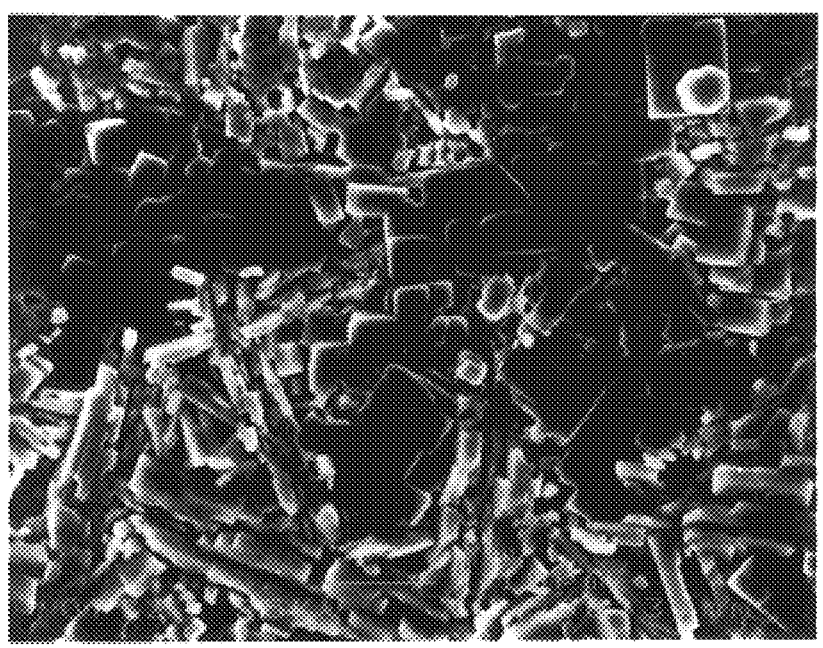

In an attempt to induce grain alignment and to improve HTSg tape density by mechanical deformation, we pressed the four samples and examined them by XRD. The XRD pattern are shown in FIGS. 5A and 5B. We found that a large induced c-axis orientation of the small Hg-1212 grains was achieved in Sample A, as indicated by the increase of F to 0.37 from 0.18 (see also Table 1). On the other hand, F deteriorated slightly in Sample D after this second pressing. This was presumably because the large Hg-1212 and Hg-1223 grains had been broken and mis-oriented by the pressing.

Figure 4A:
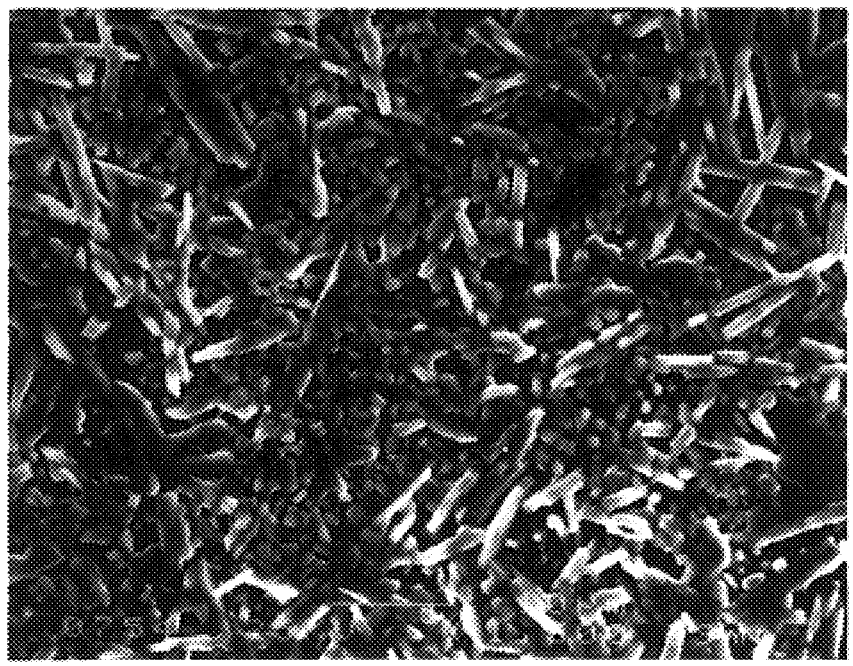
FIGS. 4A–D show the SEMs for samples A, B, C, and D after one-step press/heating processing.
Figure 4B:
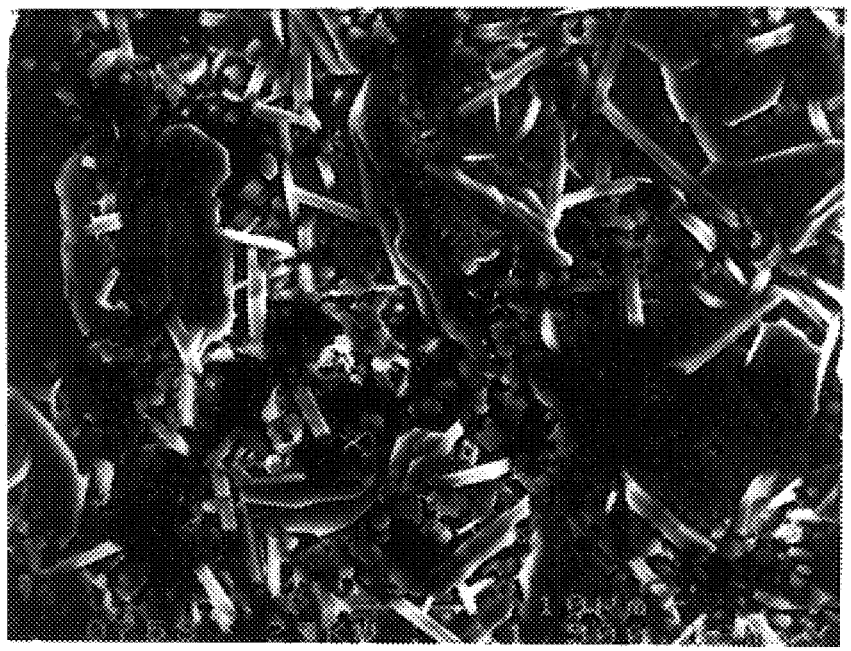
Figure 4C:
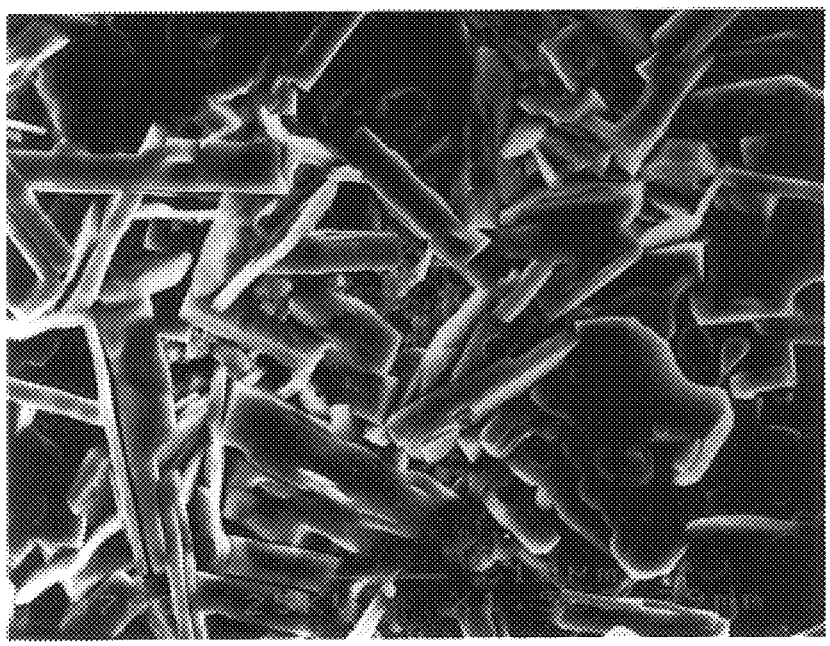
Figure 4D:

We carried out the final heat-treatment for 10 hrs at 860° C. in our two-step spray/press process on all four samples. The XRD results in FIGS. 6A–D show that all samples were basically Hg-1223 with a minute impurity of cation oxides. The F value of Sample A for Hg-1223 is 0.87 while that of Sample D degrades to 0.31 (see Table 1). The SEM data for these samples are displayed in FIGS. 7A–D. Better connected large and c-axis oriented Hg-1223 grains are obtained in Sample A, which initially consisted of only small Hg-1212 grains. Both the size and c-orientation of the Hg-1223 grains show improvement in Samples B and C, but with inferior grain connectivity compared with Sample A. Sample D exhibits Hg-1223 grains smaller than those which appeared prior to the second press/heat processing (FIG. 4D). Some of them have their c-axis parallel to the tape surface which is detrimental to $J_c$. This observation demonstrates that preferred c-oriented large Hg-1223 grains can be obtained by our two step spray/press technique via Hg-1223 grain growth using small Hg-1212 grains as nucleation centers, provided these nucleation centers have ben forced to align their c-axis perpendicular to the tape substrate by mechanical deformation.

Figure 8:
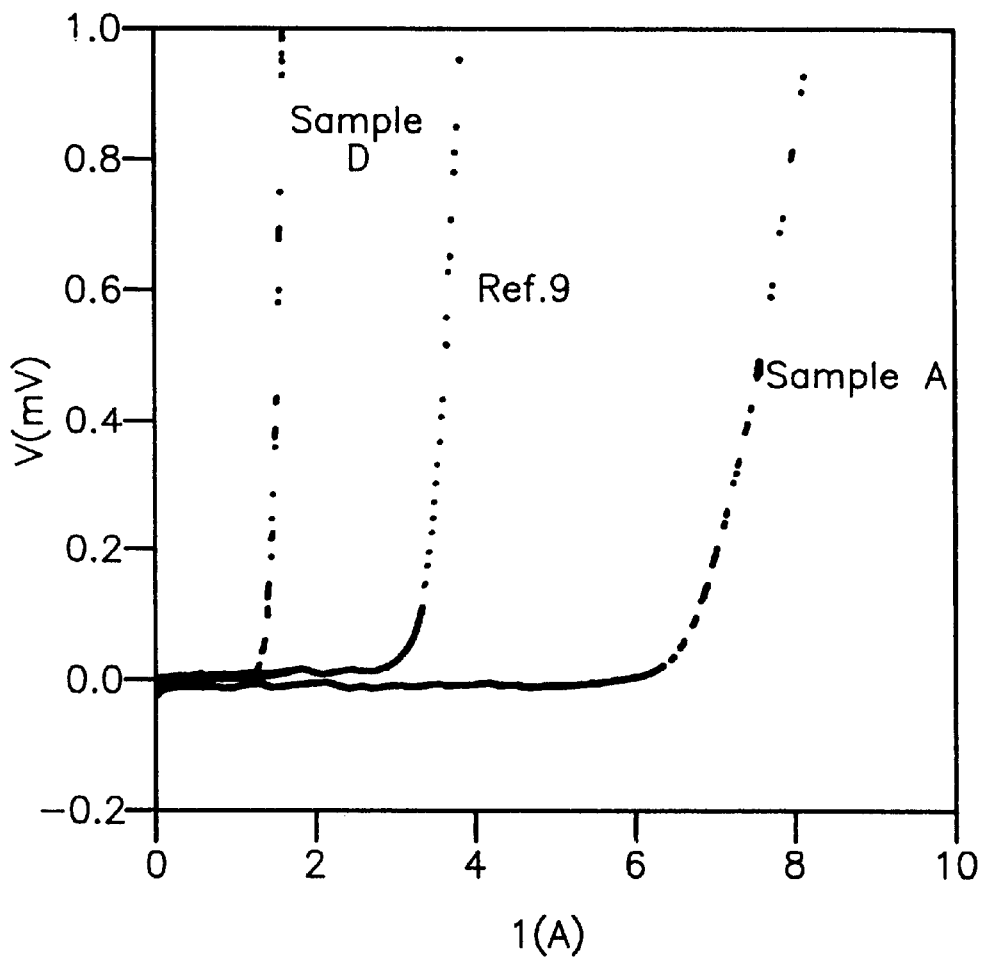
FIG. 8 shows the current-voltage characteristics of Sample A and Sample D after the second press/heat-treatment shown in FIGS. 6A and 6D.

To show that the improved grain alignment and sample density can lead to higher $J_c$, we have measured the dc current-voltage characteristics of the sample by a pulsed-current source. The results are displayed in FIG. 8. The rather large noise is attributed to the contact problem. After the second press/heat treatment, Sample A has a $J_c \sim 7 \times 10^4$ A/cm$^2$ at 77 K in its self-field with a 50 $\mu$V/cm resolution, two times that obtained by the one-step spray/press process to be described (Reference 1). The low $J_c$ of Sample C after the same second press/heat treatment is a result of the cracks in the original Hg-1212 and Hg-1223 grains caused by the pressing which the final heat-treatment failed to heal.

High temperature superconducting tapes have also been formed by a one step process. In the one step process, the pressed precursor/buffer-layer/Ni composite tape was sealed in an evacuated quartz tube with an Hg-vapor pressure source and heated to transform the precursor into Hg-1212. To control the Hg-vapor pressure, a solid Hg-source of pellets of pre-reacted $Hg_{0.75}Re_{0.1}Ba_2Ca_2CU_3Cl_{0.15}Oy$, which is the optimal Hg-stoichiometry for the formation of the Hg-1223 phase, were used. The pellets were formed by compacting the well-mixed powder of HgO, HgCl$_2$ and the precursor of $Re_{0.1}Ba_2Ca_2Cu_3O_x$. The presence of HgCl$_2$ was intended to reduce the formation time to 1 hr from 5–55 hrs reported earlier and to promote the grain growth of Hg-1223. Solid Hg-source of $Hg_{0.75}Ba_2Ca_2Cu_3O_y$ without HgCl$_2$ was also used successfully. Precursor and a longer period was allowed for the formation of Hg-1223. The precursor/buffer-layer/Ni-composite tape and the solid Hg-source were sealed inside an evacuated quartz tube and heated at 850–870° C. for 1–5 hr, followed by air-quench to room temperature. The equilibrium Hg vapor pressure of $Hg_{0.75}Re_{0.1}Ba_2Cu_3O_y$ has been measured as $\sim 2 \times 10^4$ Pa at 850° C. and $\sim 2.5 \times 10^4$ Pa at 870° C. For scale-up processing, the quartz tube can be replaced by other containers to contain the Hg-vapor. Reaction temperature outside the 850–870° C. range under this Hg-vapor pressure led to a degradation in the Hg-1223 phase purity and the c-axis alignment of the tape. Prolonged and slow cooling, e.g. over 6 hrs from 870° C. to $\sim$750° C., led to sample-degradation, presumably due to the Hg-loss. The resulting highly oriented HTSg film is represented by $(Hg_{1-x}Re_x)Ba_2Ca_2Cu_3O_{8+\delta}$ with $x\sim 0.1$.

Figure 9:
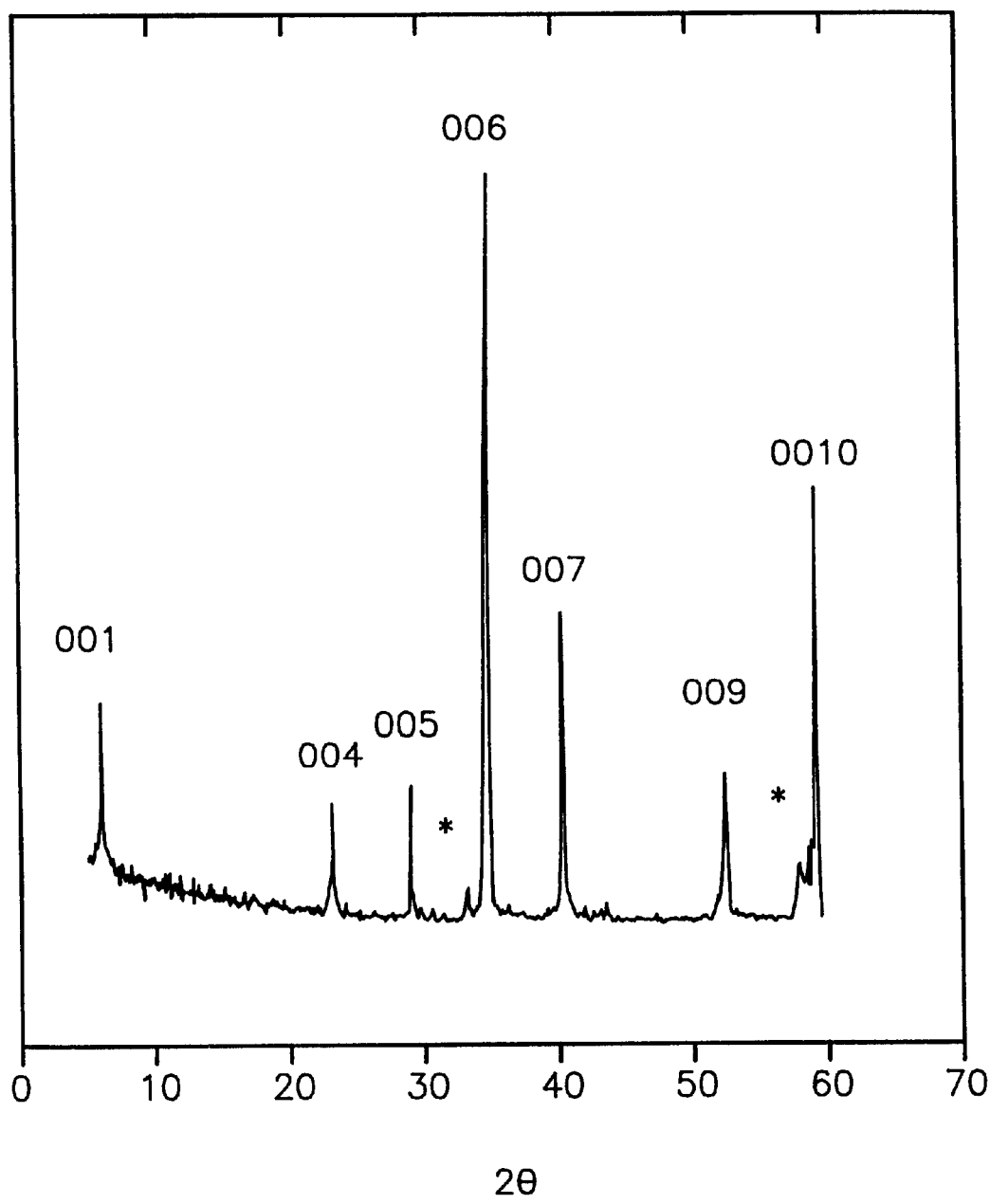
FIG. 9 shows the X-ray diffraction pattern of an Hg-1223 tape formed in a one step process.
Figure 10A:
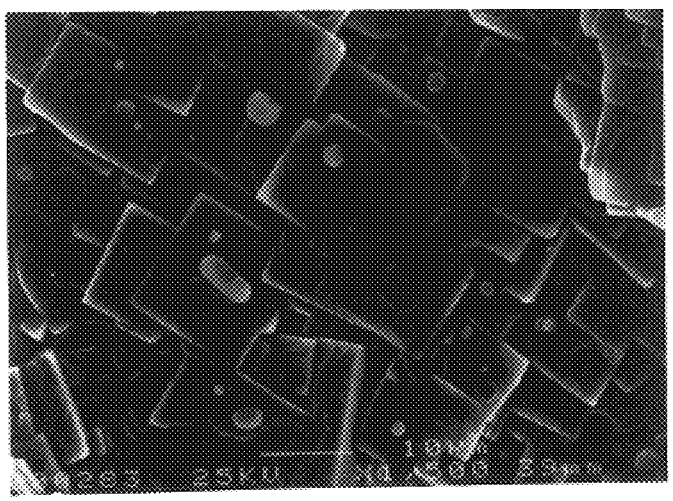
FIGS. 10A–C show the scanning electron micrograms of the Hg-1223 tape: (A) c-oriented single crystal platelets covered tape surface, (B) interruption by mis-oriented platelets and (C) interruption by unreacted oxides.
Figure 10B:
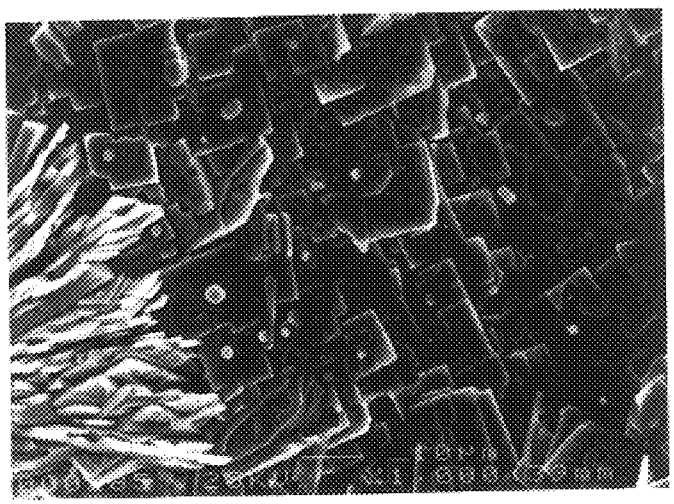
Figure 10C:
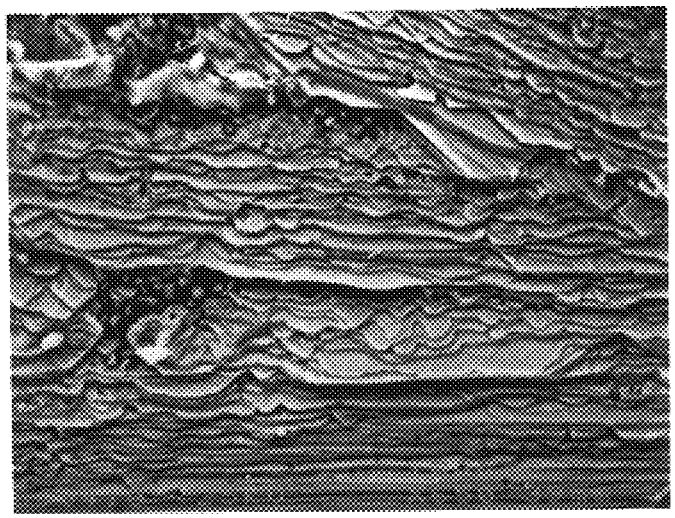

The X-ray diffraction pattern of the Hg-1223 tapes is shown in FIG. 9. A clear preferred c-axis alignment has been achieved in these tapes, as evidenced by the strong (OOl) lines of the predominant Hg-1223 phase, with only a small amount of oxide impurities. This is consistent with the scanning-electron micrograms shown in FIGS. 10A–C where the small dots are Ca$_2$CuO$_3$ and BaCuO$_2$. C-axis oriented single-crystal Hg-1223 platelets were found to stack and cover most of the area of the tape (FIG. 10) but were interrupted sometimes by mis-oriented platelets (FIG. 10) or unreacted precursor (FIG. 10). EDAX analyses on these tapes showed the absence of Hg in the Ni-substrate or Cr in the Hg-1223 grains within our resolution of $\sim$1%. The Cr-buffer layer might be oxidated into Cr$_2$O$_3$ or other impurity oxides. The four probe resistance measurement of the as synthesized Hg-1223 tape shows an onset-$T_c$ at 130 K with a zero resistance at $\sim$117 K. Using the pulse technique, the maximum $J_c$ was determined over a length of 1 cm of these tapes as-prepared to be $2.5 \times 10^4$ A/cm$^2$ at 77 K in their own field at a criterion of 50 $\mu$V/m. A greater $J_c$ was also detected in one sample. We have found that highly oriented HgBa$_2$Ca$_2$Cu$_3$O$_{8+\delta}$ films are also satisfactory.

In conclusion, highly c-oriented Hg-1223 thick-films (>10 $\mu$m) have been made for the first time on a flexible Ni-tape with a thin Cr/Ag or (Ag—Pd) buffer layer by a one step process and a preferred two step process. We have also discovered that Hg-1212 can act as nucleation centers for Hg-1223 growth, and mechanically c-axis aligned small Hg-1212 grains can give rise to c-axis oriented large Hg-1223 grains after heat-treatment. A simple two-step spray/press process has been developed to prepare high temperature superconducting tapes.

The Lotgering factor (F) of four samples prepared by one press/heat and two press/heat treatments for different reaction times is given in Table I. It demonstrates that small Hg-1212 grains with mechanically induced c-axis orientation are used to produce Hg-1223 grains with microstructures most favorable for large $J_c$ by the two-step spray/press process.

TABLE I

The values of the Lotgering factor (F) for samples prepared differently (see text)

| | After One-Step Process | | After Second Pressing | | After Two-Step Process | |
|---|---|---|---|---|---|---|
| Sample | Hg-1212 | Hg-1223 | Hg-1212 | Hg-1223 | Hg-1212 | Hg-1223 |
| A | 0.18 | -0- | 0.37 | -0- | — | 0.76/0.87 |
| B | 0.53 | -0- | — | — | — | 0.48 |
| C | 0.50 | 0.17 | — | — | — | 0.27 |
| D | 0.42 | 0.38 | 0.39 | 0.34 | — | 0.31 |

What is claimed is:

1. The method of forming a high temperature superconducting tape which comprises the steps of:

selecting a nickel tape, forming a thin chromium buffer layer or film on said tape, applying a Hg-1223 precursor to the chromium layer on one surface of said tape, and heating the nickel tape, chromium buffer and precursor in a Hg-vapor at controlled vapor pressure for a predetermined time to react the precursor with the Hg-vapor to form a superconducting layer of Hg-1223.

2. The method of claim 1 in which the precursor is doped with ReO$_2$.

3. The method of claim 1 or 2 in which the precursor layer is pressed prior to heating.

4. A method of forming a high temperature superconducting tape which comprises the steps of:

selecting a nickel tape, forming a thin chromium buffer layer or film on said tape, forming a thin film of Ag or (Ag—Pd) on the chromium buffer, thereafter applying a Hg-1223 precursor layer to the chromium layer of said tape, and heating the nickel tape, chromium buffer and precursor in a Hz-vapor at controlled vapor pressure for a predetermined time to react the precursor with the Hg-vapor to form a superconducting layer of Hz-1223.

5. A method of forming a high temperature superconducting tape which comprises the steps of:

selecting a nickel tape, forming a thin chromium buffer layer or film on said tape, applying a Hg-1223 precursor layer to the chromium layer of said tape, and heating the nickel tape, chromium buffer and precursor in a Hz-vapor at a controlled vapor pressure provided by pellets of pre-reacted $Hg_{0.75}Ba_2Ca_2Cu_3Cl_{0.15}Oy$ or $Hg_{0.75}Ba_2Ca_2Cu_3Oy$ for a predetermined time to react the precursor with the Hz-vapor to form a superconducting layer of Hg-1223.

6. The method of claim 5 in which the controlled Hg-vapor pressure is provided by pellets of pre-reacted $Hg_{0.75}Ba_2Ca_2Cu_3Oy$.

7. The method of claim 1 in which the precursor comprises pulverized treated pellets of $ReO_2$, BaO, CaO and CuO in the nominal proportion of 0.1:2:2:3.

8. The method of forming a high temperature superconducting tape which comprises the steps of:

selecting a nickel tape, forming a thin chromium buffer layer or film on said tape, applying a Hg-1223 precursor to the chromium layer on one surface of said tape, pressing the precursor layer, heating the nickel tape, chromium buffer and compressed precursor in a Hg-vapor at controlled vapor pressure for a predetermined time to react the precursor with the Hg-vapor to form a layer dispersed with small Hg-1212 particles, pressing the layer containing the small Hg-1212 to form large c-axis oriented Hg-1212 grains, and heating the pressed Hg-1212 containing tape in a Hg-vapor at controlled vapor pressure for a predetermined time to form a superconducting layer of Hg-1223.

9. A method of forming a high temperature superconducting tape which comprises the steps of:

selecting a nickel tape, forming a thin chromium buffer layer or film on said tape, forming a thin film of Ag or AgPd on the chromium buffer, thereafter applying a Hg-1223 precursor layer to the chromium layer of said tape, pressing the precursor layer, heating the nickel tape, chromium buffer and compressed precursor in a Hg-vapor at controlled vapor pressure for a predetermined time to react the precursor with the Hg-vapor to form a layer dispersed with small Hg-1212 particles, pressing the layer containing the small Hg-1212 to form large c-axis oriented Hg-1212 grains, and heating the pressed Hg-1212 containing tape in a Hg-vapor at controlled vapor pressure for a predetermined time to form a superconducting layer of Hg-1223.

10. A method of forming a high temperature superconducting tape which comprises the steps of:

selecting a nickel tape, forming a thin chromium buffer layer or film on said tape, applying a Hg-1223 precursor layer to the chromium layer of said tape, pressing the precursor layer, heating the nickel tape, chromium buffer and compressed precursor in a Hg-vapor at controlled vapor pressure provided by pellets of pre-reacted $Hg_{0.75}Ba_2Ca_2Cu_3Cl_{0.15}Oy$ or $Hg_{0.75}Ba_2Ca_2Cu_3Oy$ for a predetermined time to react the precursor with the Hg-vapor to form a layer dispersed with small Ha-1212 particles, pressing the layer containing the small Hg-1212 to form large c-axis oriented Hg-1212 grains, and heating the pressed Hg-1212 containing tape in a Hg-vapor at controlled vapor pressure for a predetermined time to form a superconducting layer of Hg-1223.

11. The method of claim 10 in which the controlled Hg-vapor pressure is provided by pellets of pre-reacted $Hg_{0.75}Ba_2Ca_2Cu_3Oy$.

12. The method of claim 8 in which the precursor comprises pulverized treated pellets of $ReO_2$, BaO, CaO and CuO in the nominal proportion of 0.1:2:2:3.

* * * * *